(12) United States Patent
Hanada

(10) Patent No.: US 9,312,096 B2
(45) Date of Patent: Apr. 12, 2016

(54) SAMPLE HOLDER

(71) Applicant: KABUSHIKI KAISHA TOSHIBA, Minato-ku, Tokyo (JP)

(72) Inventor: Kazuhiro Hanada, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/481,805

(22) Filed: Sep. 9, 2014

(65) Prior Publication Data

US 2015/0348743 A1 Dec. 3, 2015

(30) Foreign Application Priority Data

May 30, 2014 (JP) .................................. 2014-113081

(51) Int. Cl.
*H01J 37/26* (2006.01)
*H01J 37/20* (2006.01)

(52) U.S. Cl.
CPC ....................................... *H01J 37/20* (2013.01)

(58) Field of Classification Search
USPC ............... 250/440.11, 441.11, 442.11, 453.1, 250/492.1, 492.2, 492.3
See application file for complete search history.

(56) References Cited

U.S. PATENT DOCUMENTS

| | | | |
|---|---|---|---|
| 6,677,595 B1* | 1/2004 | Aiba ........................ | 250/442.11 |
| 2004/0129897 A1* | 7/2004 | Adachi et al. ............... | 250/492.3 |
| 2012/0112064 A1* | 5/2012 | Nagakubo .............. | G01N 1/286 250/307 |
| 2012/0189813 A1* | 7/2012 | Lechner et al. ............... | 428/156 |

FOREIGN PATENT DOCUMENTS

| | | |
|---|---|---|
| JP | 2005100995 A | 4/2005 |
| JP | 2008123891 A | 5/2008 |
| JP | 2010055988 A | 3/2010 |

\* cited by examiner

*Primary Examiner* — Nicole Ippolito
(74) *Attorney, Agent, or Firm* — Holtz, Holtz & Volek PC

(57) ABSTRACT

A sample holder according to an embodiment is a sample holder on which a sample to be observed with an electron microscope is mounted. The sample holder includes a support unit, a holder body, and a rotation mechanism. The support unit has a longitudinal direction and has a first end on which the sample can be mounted. The holder body holds the support unit at a second end on the opposite side from the first end. The rotation mechanism is provided inside the holder body and rotates the support unit with the longitudinal direction serving as an axis. A central axis of the holder body and a rotation axis of the support unit are axes in substantially same directions.

19 Claims, 4 Drawing Sheets

SAMPLE HOLDER

CROSS REFERENCE TO RELATED APPLICATIONS

This application is based upon and claims the benefit of priority from the prior Japanese Patent Application No. 2014-113081, filed on May 30, 2014, the entire contents of which are incorporated herein by reference.

FIELD

Embodiments described herein relate to a sample holder.

BACKGROUND

Conventionally, in an analysis technique for a semiconductor device, a focused ion beam (hereinafter, also FIB) is used when a sample is to be processed. A transmission electron microscope (hereinafter, also TEM) is used during shape observation of a processed sample. The FIB and the TEM are analysis techniques suitable for downscaling in a manufacturing process of a semiconductor device.

In the TEM, the film thickness of a sample needs to be sufficiently small. Meanwhile, in processing of a sample with the FIB, a portion necessary for processing (hereinafter, also "necessary portion") is first extracted from a sample body using a manipulator probe or the like. The extracted necessary portion is then fixed to a mesh supported on an upper portion of a holder. Thin film processing with the FIB is then performed on the necessary portion.

However, in a semiconductor device including various materials, it is difficult to even, that is, to flatten a processing surface to be processed with the FIB due to different etching rates according to the materials. To address this problem, it is conceivable to process the semiconductor device from many directions. In this case, a conventional method requires control on both attitudes of the necessary portion and the mesh before the necessary portion is fixed to the mesh after the extraction. This causes the processing of the semiconductor device from many directions to be difficult. As a result, it is difficult to ensure evenness in the processing surface of the semiconductor device by the conventional method.

During the observation with the TEM, the holder supporting the mesh from below becomes a barrier that blocks transmission of electron beams. Accordingly, the sample can be observed only from directions in which the holder does not block the electron beams and there is a large restriction on the observation directions of the sample.

Furthermore, with the TEM, an energy-dispersive X-ray analysis (hereinafter, also TEM-EDX) is performed in some cases. In these cases, the holder becomes a factor of occurrence of a background signal. The background signal adversely affects analysis accuracy of the TEM-EDX.

DETAILED DESCRIPTION

A sample holder according to an embodiment is a sample holder on which a sample to be observed with an electron microscope is mounted. The sample holder includes a support unit, a holder body, and a rotation mechanism. The support unit has a longitudinal direction and has a first end on which the sample can be mounted. The holder body holds the support unit at a second end on the opposite side from the first end. The rotation mechanism is provided inside the holder body and rotates the support unit with the longitudinal direction serving as an axis. A central axis of the holder body and a rotation axis of the support unit are axes in substantially same directions.

Embodiments of the present invention will be explained below with reference to the accompanying drawings. The present invention is not limited to the embodiments.

Figure 1A:
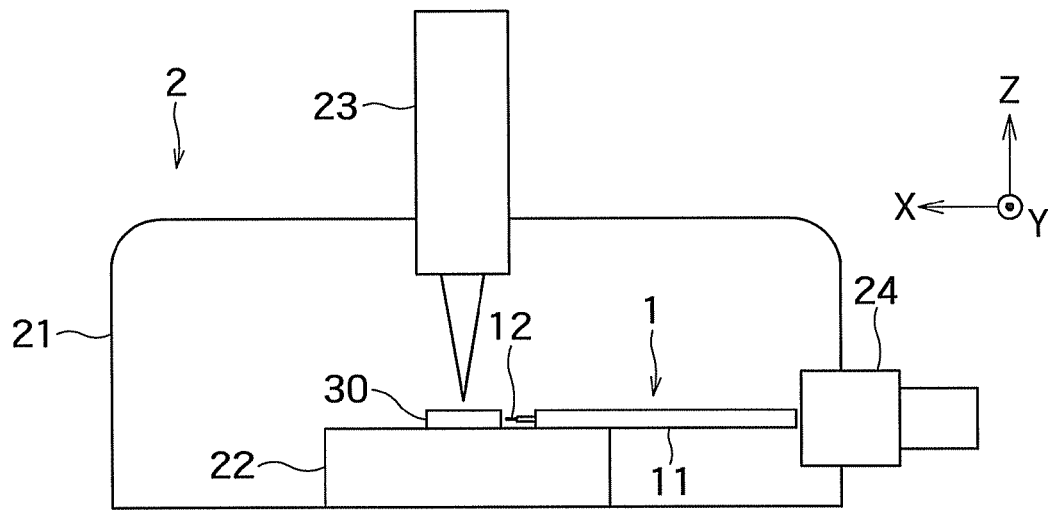
FIGS. 1A to 1C are schematic diagrams showing an example of a configuration of a sample holder 1 according to the present embodiment.
Figure 1B:
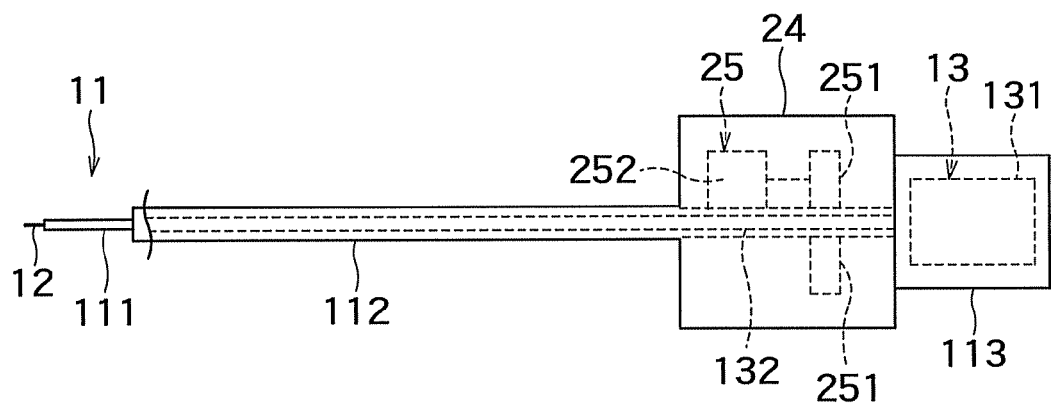
Figure 1C:
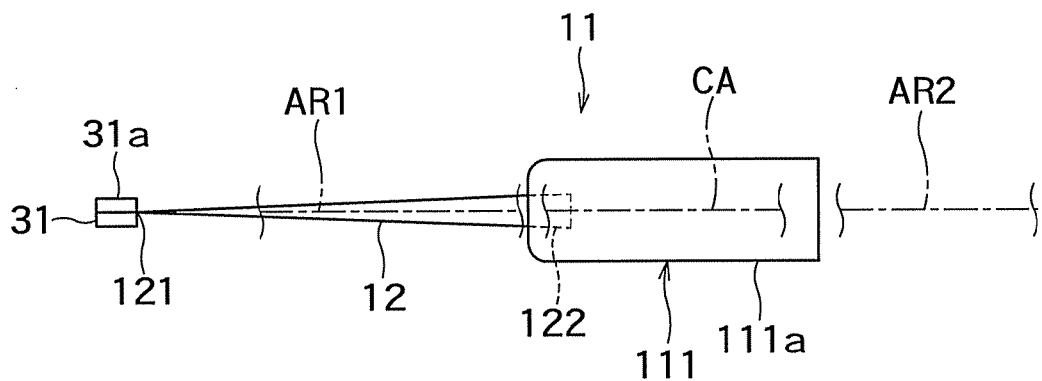

FIGS. 1A to 1C are schematic diagrams showing an example of a configuration of a sample holder 1 according to the present embodiment. FIG. 1A is a schematic diagram of the sample holder 1 attached to an FIB processing device 2. FIG. 1B is an enlarged view of a holder body 11. FIG. 1C is an enlarged view of a distal end portion and a support mesh 12 of the holder body 11. As shown in FIG. 1A, the sample holder 1 can be attached to the FIB processing device 2. A seal unit 24 in FIG. 1B is a member mounted on the FIB processing device 2 and the holder body 11 does not practically have the seal unit 24. However, the holder body 11 can include the seal unit 24.

The FIB processing device 2 is first explained in detail.

As shown in FIG. 1A, the FIB processing device 2 includes a vacuum chamber 21, a stage 22, an FIB irradiation unit 23, and the seal unit 24.

In the vacuum chamber 21, a sample 31 (see FIG. 1C) to be observed with an electron microscope is processed by an FIB method. This processing includes processing of extracting the sample 31 from a sample body 30, processing of thinning the sample 31, and the like.

The stage 22 is arranged in the vacuum chamber 21. As shown in FIG. 1A, the sample body 30 is placed on the stage 22. The sample body 30 corresponds to a base material of the sample 31.

The FIB irradiation unit 23 irradiates an FIB toward the stage 22. The FIB has an etching function to process the sample 31 and a film formation function to cause the sample 31 to adhere to a manipulator probe 26 or the support mesh 12. Therefore, not only the sample body 30 placed on the stage 22 and the sample 31 supported on the sample holder 1 but also the sample 31 held by the manipulator probe 26 (explained later) is irradiated with the FIB.

The seal unit 24 seals the vacuum chamber 21 from outside air while the sample holder 1 is held by the FIB processing device 2.

The sample holder 1 is next explained in detail.

As shown in FIG. 1B, the sample holder 1 includes the support mesh 12 as an example of a support unit, the holder body 11, and a rotation mechanism 13. The seal unit 24 in FIG. 1B is not a constituent unit of the sample holder 1 but a constituent unit of the FIB processing device 2 as explained above.

As shown in FIG. 1C, the support mesh 12 has a longitudinal direction and the sample 31 can be mounted on a distal end portion 121 being a first end. The longitudinal direction of the support mesh 12 is an extending direction of a rotation axis AR1 of the support mesh 12. The support mesh 12 is formed of, for example, metal. On the support mesh 12, the sample 31 is firmly stuck to the distal end portion 121 using the film formation function of the FIB. Accordingly, the sample 31 can be stably supported on the support mesh 12 without the need of a special device for supporting the sample 31 on the support mesh 12.

The support mesh 12 is formed to have a diameter that becomes smaller toward the distal end portion 121. That is, the support mesh 12 is formed in a needle shape. More specifically, the support mesh 12 has a diameter that is gradually reduced toward the distal end portion 121. The support mesh 12 can have a diameter that is reduced in a stepwise manner toward the distal end portion 121.

The support mesh 12 can be attached to or detached from the holder body 11 or the rotation mechanism 13 via a proximal end portion 122 being the second end on the opposite side from the first end. The configuration to enable the support mesh 12 to be attached to or detached from the holder body 11 or the rotation mechanism 13 is not particularly limited thereto. For example, the proximal end portion 122 of the support mesh 12 and the holder body 11 or the rotation mechanism 13 can have shapes that are fitted or screwed to each other. Alternatively, the proximal end portion 122 of the support mesh 12 and the holder body 11 or the rotation mechanism 13 can be attached to or detached from each other via another member such as a clamp member or a fastening member.

The holder body 11 holds the support mesh 12 on the proximal end portion 122 (see FIG. 1C) of the support mesh 12. The support mesh 12 can be attached to either the holder body 11 or the rotation mechanism 13. For example, when the support mesh 12 is fixedly held on the distal end portion of the holder body 11, the holder body 11 rotates in conjunction with a transmission shaft 132 of the rotation mechanism 13 (explained later). In this way, the holder body 11 transmits power of the rotation mechanism 13 to the support mesh 12. Alternatively, when the support mesh 12 is fixedly held by the transmission shaft 132 of the rotation mechanism 13, the holder body 11 does not rotate and the transmission shaft 132 of the rotation mechanism 13 transmits the power of the rotation mechanism 13 to the support mesh 12. In this case, the holder body 11 holds the support mesh 12 via the transmission shaft 132. The holder body 11 can also be formed of metal or the like.

As shown in FIG. 1B, the holder body 11 includes a holder distal end portion 111, a rod unit 112, and a handle unit 113. These constituent units 111, 112, and 113 of the holder body 11 can be inseparable from each other or can be separated from each other.

The holder distal end portion 111 holds the support mesh 12 on one end side thereof (the left side in FIG. 1B). As shown in FIG. 1C, the holder distal end portion 111 has a central axis CA. The central axis CA can be a central axis common to the whole of the holder body 11. That is, the central axis CA can be common to the holder distal end portion 111, the support mesh 12, and the rotation mechanism 13.

The central axis CA of the holder distal end portion 111 is an axis substantially in the same direction as the rotation axis AR1 of the support mesh 12. Accordingly, flexibility in rotation of the support mesh 12 can be ensured and also the radial thickness of the sample holder 1 can be suppressed. The central axis CA of the holder distal end portion 111 can be the same as the rotation axis AR1 of the support mesh 12. This further suppresses the radial thickness of the sample holder 1.

Furthermore, the holder distal end portion 111 has an outer peripheral surface 111a in a tube shape that surrounds the central axis CA. The central axis of the outer peripheral surface 111a of the holder distal end portion 111 can be matched with the central axis CA of the holder distal end portion 111. The central axis of the outer peripheral surface 111a of the holder distal end portion 111 can be coaxial with the rotation axis AR1 of the support mesh 12. This also suppresses the radial thickness of the sample holder 1. An outer peripheral surface of the holder body 11 other than the holder distal end portion 111 can be also coaxial with the central axis CA of the holder distal end portion 111 or the rotation axis AR1 of the support mesh 12. The outer peripheral surface 111a of the holder distal end portion 111 can be, for example, a cylindrical surface.

The rod unit 112 is connected at one end thereof (the left end in FIG. 1B) to the other end (the right end in FIG. 1B) of the holder distal end portion 111. The rod unit 112 extends in the longitudinal direction of the support mesh 12 and is formed in a cylindrical shape. The transmission shaft 132 of the rotation mechanism 13 passes through the inside of a cylinder of the rod unit 112 to be rotatable therein. The central axis of the rod unit 112 can be coaxial with the rotation axis AR1 of the support mesh 12.

The handle unit 113 is connected to the other end (the right end in FIG. 1B) of the rod unit 112. The handle unit 113 incorporates therein a motor 131 of the rotation mechanism 13 (explained later). An outer peripheral surface of the handle unit 113 can also be, for example, a cylindrical surface.

The rotation mechanism 13 is provided inside the holder body 11. The rotation mechanism 13 rotates the support mesh 12 using the longitudinal direction of the support mesh 12 as an axis. That is, the rotation mechanism 13 rotates the support mesh 12 around the rotation axis AR1 (see FIG. 1C). The rotation mechanism 13 can rotate the support mesh 12 to an arbitrary angle between 0° and 360° and can stop the support mesh 12 at the angle. As shown in FIG. 1C, a rotation axis AR2 of the rotation mechanism 13 is substantially coaxial with the rotation axis AR1 of the support mesh 12.

More specifically, the rotation mechanism 13 has the motor 131 and the transmission shaft 132 as shown in FIG. 1B.

The motor 131 is connected to a power supply unit (not shown) and is rotationally driven according to energization from the power supply unit. A motor shaft of the motor 131 can be arranged in parallel to the longitudinal direction of the support mesh 12 or can be arranged vertically. Control on the rotation angle of the support mesh 12 can be executed according to control on the amount of rotation of the motor 131, for example, control on the number of energization pulses to be applied to the motor 131.

The transmission shaft 132 extends in the longitudinal direction of the rod unit 112 and passes through the inside of the rod unit 112. The transmission shaft 132 transmits power of the motor 131 to the support mesh 12. For example, the transmission shaft 132 rotates by the power of the motor 131 and transmits torque produced by the rotation to the support mesh 12. For this purpose, the rotation axis of the transmission shaft 132 is coaxial with the rotation axis AR1 of the support mesh 12. The transmission shaft 132 is formed of, for example, metal.

The configuration to transmit the rotation of the transmission shaft 132 to the support mesh 12 is not limited thereto. For example, the transmission shaft 132 can be fixed directly to the motor shaft of the motor 131 or connected to the motor shaft of the motor 131 indirectly via a power transmission member such as a gear. The support mesh 12 can be attached directly to a distal end portion of the transmission shaft 132 coaxially with the transmission shaft 132, or connected indirectly to the transmission shaft 132 via a power transmission unit (not shown).

A mechanism that modifies the position of the sample 31 supported on the support mesh 12 in a state attached to the FIB processing device 2 is explained next.

The holder body 11 moves the position of the sample 31 in at least one of X, Y, and Z directions shown in FIG. 1A in a state being attached to the FIB processing device 2. This movement of the holder body 11 is achieved by a movement mechanism 25 arranged inside the seal unit 24 shown in FIG. 1B. The X direction is an example of a first direction along the longitudinal direction of the support mesh 12. The Y direction is an example of a second direction orthogonal to the first direction. The Z direction is an example of a third direction orthogonal to both the first and second directions.

The movement mechanism 25 includes, for example, a clamp unit 251 that clamps the rod unit 112, and a triaxial motor 252 coupled to the clamp unit 251 as shown in FIG. 1B.

In the holder body 11 in the state being attached to the FIB processing device 2, a portion (specifically, the proximal end portion) of the rod unit 112 is located in the seal unit 24. The holder body 11 is clamped, that is, connected to the clamp unit 251 via the rod unit 112 located in the seal unit 24. The holder body 11 connected to the clamp unit 251 is moved in at least one of the X, Y, and Z directions by power of the triaxial motor 252. Accordingly, the position of the sample 31 supported on the support mesh 12 is moved and modified in at least one of the X, Y, and Z directions.

Alternatively, modification of the position of the sample 31 supported on the support mesh 12 can be performed in a state where the holder body 11 is attached on an electron microscope. In this case, an identical movement mechanism to the movement mechanism 25 as mentioned above can be provided in the electron microscope. The electron microscope can include a vacuum chamber and a seal unit similarly to the FIB processing device 2.

A first example of an operation of the sample holder 1 at the time of sample processing is explained next.

Figure 2A:
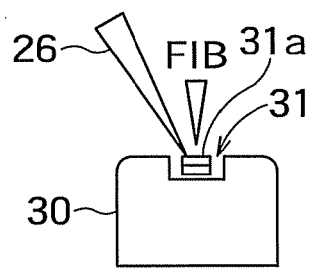
FIGS. 2A to 2D are process charts schematically showing the first example of the operation of the sample holder 1 at the time of sample processing.
Figure 2B:
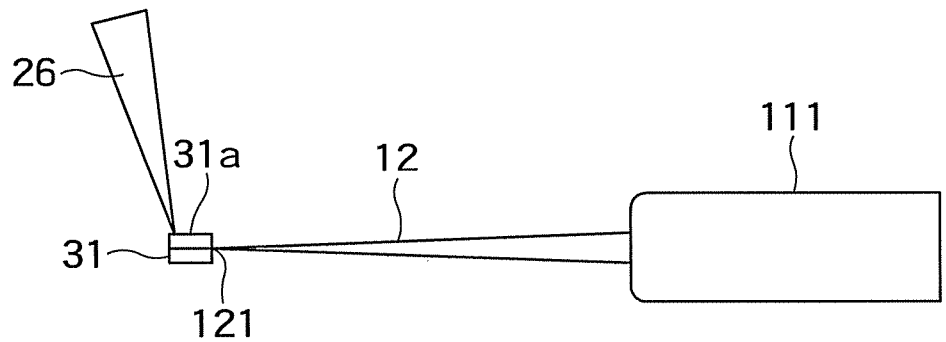
Figure 2C:
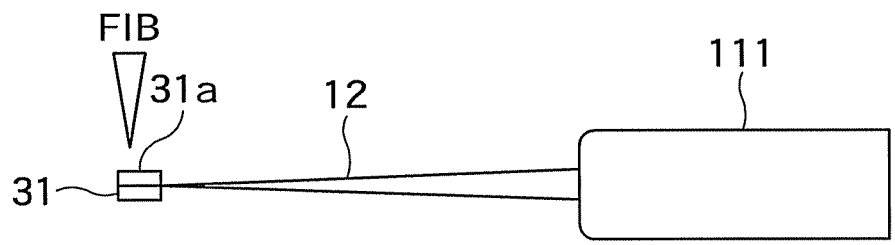
Figure 2D:
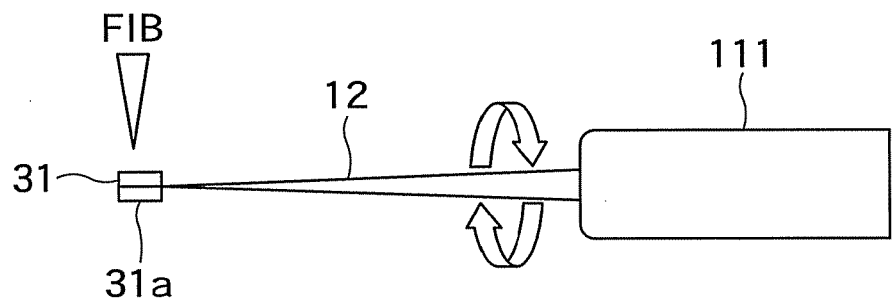

FIGS. 2A to 2D are process charts schematically showing the first example of the operation of the sample holder 1 at the time of sample processing. FIG. 2A shows a process of extracting the sample 31 from the sample body 30 (hereinafter, "extraction process"). FIG. 2B shows a process of mounting the sample 31 on the support mesh 12 (hereinafter, "support process"). FIG. 2C shows a process of processing the sample 31 (hereinafter, "processing process"). FIG. 2D shows a process of changing the processing direction (hereinafter, "change process").

The extraction process of the sample 31 is first performed as shown in FIG. 2A. To perform the present process, the sample holder 1 is attached to the FIB processing device 2 and the sample body 30 is placed on the stage 22 in advance as shown in FIG. 1A. Irradiation with an FIB by the FIB irradiation unit 23 is then performed on the sample body 30 placed on the stage 22 as shown in FIG. 2A. Reference character 31a denotes a surface layer of a semiconductor device. The sample 31 is then extracted from the sample body 30 using the manipulator probe 26. At that time, the etching function of the FIB is used to cut the sample body 30. The film formation function of the FIB is used to cause the sample 31 to adhere to the manipulator probe 26. The sample 31 is extracted in a state being adhered to the manipulator probe 26.

The support process of the sample 31 is then performed as shown in FIG. 2B. In the present process, the manipulator probe 26 in a state of holding the sample 31 is moved to bring the sample 31 into contact with the distal end portion 121 of the support mesh 12. The FIB irradiation unit 23 irradiates the sample 31 in contact with the distal end portion 121 of the support mesh 12 with an FIB. Accordingly, the sample 31 is caused to adhere to the distal end portion 121 of the support mesh 12. At that time, the FIB irradiation unit 23 causes the sample 31 to adhere to the distal end portion 121 of the support mesh 12 using the film formation function of the FIB. The FIB irradiation unit 23 then separates the sample 31 from the manipulator probe 26 using the etching function of the FIB.

The processing process of the sample 31 is then performed as shown in FIG. 2C. In the present process, the FIB irradiation unit 23 irradiates the sample 31 supported on the support mesh 12 with an FIB, thereby thinning the sample 31. At that time, the etching function of the FIB is used.

The change process of the processing direction is then performed as shown in FIG. 2D. In the present process, the rotation mechanism 13 rotates the support mesh 12 in a rotation direction indicated by arrows in FIG. 2D (in a rotation direction with the longitudinal direction of the support mesh 12 serving as an axis). The rotation mechanism 13 rotates the sample 31 to an arbitrary angle and then stops the sample 31, thereby changing the processing direction of the sample 31 to a desired direction. Accordingly, the FIB irradiation unit 23 can process the sample 31 from an arbitrary direction.

A second example of the operation of the sample holder 1 at the time of sample processing is explained next.

Figure 3A:
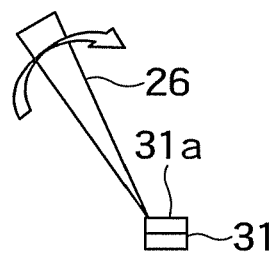
FIGS. 3A to 3C are process charts schematically showing the second example of the operation of the sample holder 1 at the time of sample processing.
Figure 3B:
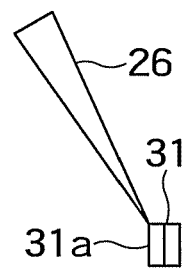
Figure 3C:
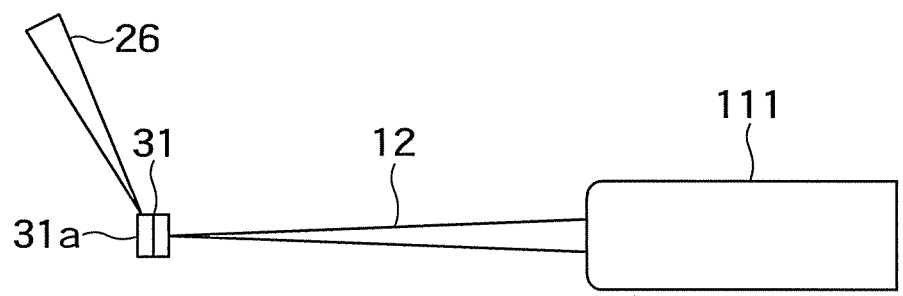

FIGS. 3A to 3C are process charts schematically showing the second example of the operation of the sample holder 1 at the time of sample processing. FIG. 3A shows an attitude change process of the sample 31. FIG. 3B shows the sample 31 after an attitude change. FIG. 3C shows a process of mounting the sample 31 on the support mesh 12 (hereinafter, "support process").

After the extraction process shown in FIG. 2A, the attitude change process of the sample 31 shown in FIG. 3A is performed. In the present process, the manipulator probe 26 is rotated, for example, in a direction indicated by an arrow in FIG. 3A, that is, around the central axis of the manipulator probe 26.

Rotation of the manipulator probe 26 changes the attitude of the sample 31 as shown in FIG. 3B. Specifically, while facing upward as shown in FIG. 3A before the attitude change of the sample 31, the surface layer 31a of the sample 31 faces to the left after the attitude change as shown in FIG. 3B.

The support process of the sample 31 is then performed as shown in FIG. 3C. In the present process, the manipulator probe 26 moves the sample 31 after the attitude change to the position of the distal end portion 121 of the support mesh 12 while keeping the attitude shown in FIG. 3B. The FIB irradiation unit 23 then irradiates the sample 31 with an FIB to cause the sample 31 to adhere to the support mesh 12 and to separate the sample 31 from the manipulator probe 26 in an identical manner to that shown in FIG. 2B.

After the process shown in FIG. 3C, the processing process of the sample 31 explained with reference to FIG. 2C and the change process of the processing direction explained with reference to FIG. 2D are sequentially performed.

The second example enables the sample 31 to adhere to the support mesh 12 in an attitude different from that in the first example. In this way, the sample holder 1 according to the present embodiment enables the sample 31 to adhere to the support mesh 12 in various attitudes. This increases the flexibility in the processing direction of the sample 31. The sample 31 is enabled to adhere to the support mesh 12 in various attitudes not limited to those in the first and second examples.

As described above, the sample holder 1 according to the present embodiment can change the attitude of the sample 31 easily and promptly by rotating the support mesh 12 with the rotation mechanism 13. That is, the sample holder 1 according to the present embodiment can change the processing direction of the sample 31 easily and promptly and can easily process the sample 31 also from directions other than that of the device surface. As a result, evenness in the processing surface can be ensured easily and appropriately.

Furthermore, the sample holder 1 according to the present embodiment can further enhance flexibility in the control on the processing direction of the sample 31 by rotating the manipulator probe 26 as shown in the second example (see FIG. 3A).

An example of an operation of the sample holder 1 at the time of sample observation with an electron microscope is explained next.

Figure 4A:
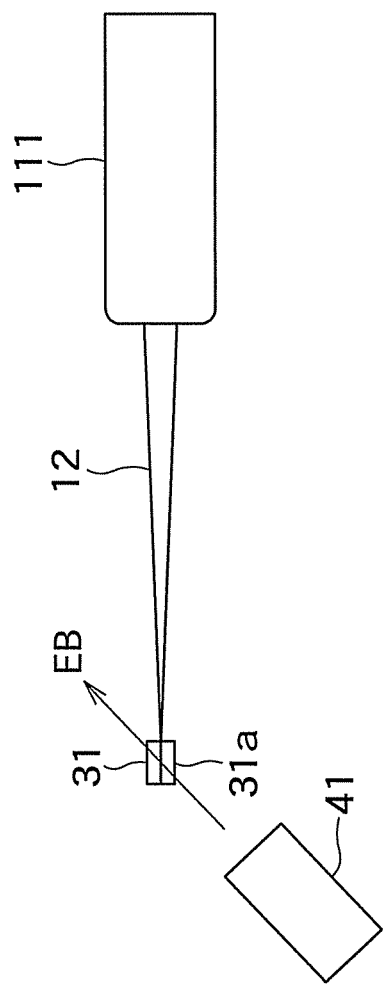
FIGS. 4A and 4B are process charts schematically showing the example of the operation of the sample holder 1 at the time of sample observation.
Figure 4B:
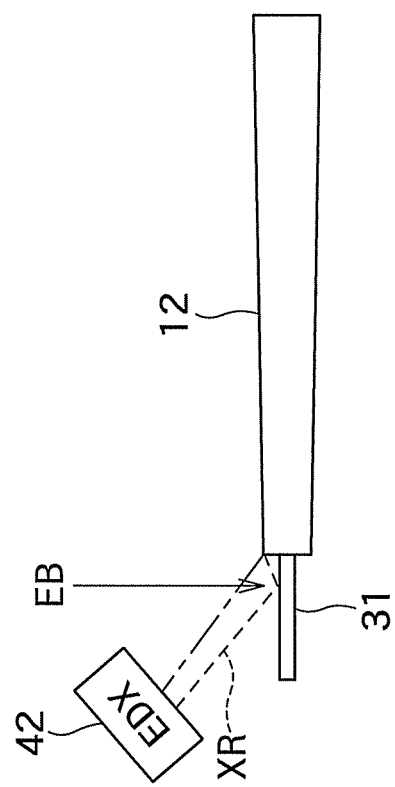

FIGS. 4A and 4B are process charts schematically showing the example of the operation of the sample holder 1 at the time of sample observation. FIG. 4A shows an observation process by a TEM method. FIG. 4B shows an observation process by a TEM-EDX method. As shown in FIG. 4A, an electron microscope includes an electron beam source 41. Although not shown, the electron microscope also includes a detector that detects electron beams having transmitted through the sample 31. The electron microscope further includes an energy-dispersive X-ray analyzer (hereinafter, "EDX device") 42 as shown in FIG. 4B.

In the observation process by the TEM method, the sample holder 1 attached to the FIB processing device 2 is mounted on the electron microscope together with the sample 31 supported on the support mesh 12. As described above, the sample holder 1 can be used in common for the FIB processing and for the electron microscope observation.

In the present process, the electron beam source 41 irradiates the sample 31 with electron beams (EB) and the detector detects the electron beams having transmitted through the sample 31. Observation of the sample 31 is thereby performed. At that time, the rotation mechanism 13 (see FIG. 1B) can rotate the support mesh 12 to change the attitude of the sample 31 with respect to the electron beam source 41. In this way, an observation position of the sample 31 can be appropriately changed.

In the observation process by the TEM-EDX method shown in FIG. 4B, an X-ray irradiation unit of the EDX device 42 irradiates the sample 31 with X-rays (XR) and a detector of the EDX device 42 detects the X-rays having reflected from the sample 31. A configuration or a material of the sample 31 can be thereby analyzed.

The support mesh 12 according to the present embodiment is formed in a needle shape and is thin in the radial thickness. The holder body 11 is also formed thin in the radial thickness. Accordingly, at the time of observation by the TEM method, the quantity of electron beams screened by the support mesh 12 or the holder distal end portion 111 is small and thus a restriction on observation directions is small. As a result, the sample holder 1 according to the present embodiment can increase flexibility in the observation directions. Furthermore, the sample holder 1 according to the present embodiment can change the attitude of the sample 31 with respect to the electron beam source 41 using the rotation mechanism 13. Accordingly, the restriction on observation directions can be further reduced.

Furthermore, while the needle-shaped support mesh 12 is located around (near) the sample 31, other members are not located around (near) the sample 31 at the time of observation by the TEM-EDX method because the radial thicknesses of the holder body 11 and the support mesh 12 are small. Therefore, the quantity of X-rays reflected on the sample holder 1 is relatively small and the quantity of X-rays reflected on the sample 31 is relatively large. That is, occurrence of a background signal can be reduced, which increases a ratio of the quantity of X-rays from the sample 31 to the quantity of X-rays from the sample holder 1. As a result, accuracy in an analysis of the material of the sample 31 can be enhanced and also minor components included in the sample 31 can be appropriately detected.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A sample holder on which a sample to be observed with an electron microscope is mounted, the sample holder comprising:
a support unit extending in a first longitudinal direction and having a first end on which the sample can be mounted;
a holder body extending in a second longitudinal direction parallel to the first longitudinal direction, wherein the holder body holds the support unit at a second end of the support unit on an opposite side from the first end and is connected directly to the support unit; and
a rotation mechanism provided inside the holder body and configured to rotate the support unit with the first longitudinal direction serving as a rotation axis of the support unit,
wherein a central axis of the holder body and the rotation axis of the support unit are axes in substantially same directions.

2. The sample holder of claim 1, wherein the support unit is formed to have a diameter reducing toward the first end.

3. The sample holder of claim 2, wherein the support unit is formed in a needle shape.

4. The sample holder of claim 3, wherein the rotation mechanism rotates the support unit to an arbitrary angle.

5. The sample holder of claim 4, wherein the holder body has an outer peripheral surface coaxial with the rotation axis of the support unit.

6. The sample holder of claim 3, wherein the holder body has an outer peripheral surface coaxial with the rotation axis of the support unit.

7. The sample holder of claim 2, wherein the rotation mechanism rotates the support unit to an arbitrary angle.

8. The sample holder of claim 7, wherein the holder body has an outer peripheral surface coaxial with the rotation axis of the support unit.

9. The sample holder of claim 2, wherein the holder body has an outer peripheral surface coaxial with the rotation axis of the support unit.

10. The sample holder of claim 1, wherein the rotation mechanism rotates the support unit to an arbitrary angle.

11. The sample holder of claim 10, wherein the holder body has an outer peripheral surface coaxial with the rotation axis of the support unit.

12. The sample holder of claim 1, wherein the holder body has an outer peripheral surface coaxial with the rotation axis of the support unit.

13. The sample holder of claim 1, wherein a rotation axis of the rotation mechanism and the rotation axis of the support unit are substantially coaxial with each other.

14. The sample holder of claim 1, wherein the support unit is attachable to or detachable from the holder body or the rotation mechanism.

15. The sample holder of claim 1, wherein the holder body is attachable to or detachable from both of a FIB (Focused Ion Beam) processing device for processing the sample and the electron microscope.

16. The sample holder of claim 15, wherein the electron microscope is a transmission electron microscope including an X-ray analyzer to be used for an element analysis of the sample.

17. The sample holder of claim 15, wherein the holder body is moveable in a state of being attached to the FIB processing device or the electron microscope in at least one of the second longitudinal direction, a first orthogonal direction orthogonal to the second longitudinal direction, and a second orthogonal direction orthogonal to both the second longitudinal direction and the first orthogonal direction, thereby modifying a position of the sample.

18. The sample holder of claim 17, wherein:
the FIB processing device or the electron microscope comprises a vacuum chamber, a seal unit configured to seal the vacuum chamber from outside air, and a movement mechanism located inside the seal unit and configured to move the holder body in at least one of the second longitudinal direction, the first orthogonal direction, and the second orthogonal direction,
the holder body comprises:
a holder distal end portion configured to hold the support unit on a side of a first end of the holder distal end portion;
a hollow rod unit connected to a second end of the holder distal end portion via a first end of the rod unit; and
a handle unit connected to a second end of the rod unit,
the rotation mechanism comprises:
a motor incorporated in the handle unit; and
a transmission shaft passing through an inside of the rod unit to transmit power of the motor to the support unit, and
the holder body moves the sample in at least one of the second longitudinal direction, the first orthogonal direction, and the second orthogonal direction and the second and third directions by being connected to the movement mechanism via a part of the rod unit located inside the seal unit.

19. The sample holder of claim 1, wherein:
the holder body comprises:
a holder distal end portion configured to hold the support unit on a side of a first end of the holder distal end portion;
a hollow rod unit connected to a second end of the holder distal end portion via a first end of the rod unit; and
a handle unit connected to a second end of the rod unit,
the rotation mechanism comprises:
a motor incorporated in the handle unit; and
a transmission shaft passing through an inside of the rod unit to transmit power of the motor to the support unit, and
a rotation axis of the transmission shaft is coaxial with the rotation axis of the support unit.

* * * * *